(12) United States Patent
Fujisaki

(10) Patent No.: US 7,529,989 B2
(45) Date of Patent: May 5, 2009

(54) TESTING APPARATUS AND TESTING METHOD

(75) Inventor: Kenichi Fujisaki, Tokyo (JP)

(73) Assignee: Advantest Corporation, Tokyo (JP)

( * ) Notice: Subject to any disclaimer, the term of this patent is extended or adjusted under 35 U.S.C. 154(b) by 353 days.

(21) Appl. No.: 11/511,854

(22) Filed: Aug. 29, 2006

(65) Prior Publication Data

US 2007/0208969 A1     Sep. 6, 2007

Related U.S. Application Data

(63) Continuation of application No. PCT/JP2005/004010, filed on Mar. 8, 2005.

(30) Foreign Application Priority Data

Mar. 16, 2004     (JP)     ............................. 2004-074057

(51) Int. Cl.
*G11C 29/00* (2006.01)
*G01R 31/28* (2006.01)

(52) U.S. Cl. ........................ 714/723; 714/718; 714/719; 714/733; 714/738

(58) Field of Classification Search .................. 714/723, 714/718, 719, 733, 738
See application file for complete search history.

(56) References Cited

U.S. PATENT DOCUMENTS

| | | | | |
|---|---|---|---|---|
| 5,831,989 A | * | 11/1998 | Fujisaki | ....................... 714/723 |
| 6,425,095 B1 | * | 7/2002 | Yasui | .......................... 714/42 |
| 6,578,169 B1 | | 6/2003 | Le et al. | |

FOREIGN PATENT DOCUMENTS

JP     2001-311762 A     11/2001

\* cited by examiner

*Primary Examiner*—Cynthia Britt
*Assistant Examiner*—John J Tabone, Jr.
(74) *Attorney, Agent, or Firm*—Osha · Liang LLP

(57) ABSTRACT

A testing apparatus according to the present invention includes: a pattern generator for generating an address signal, a data signal and an expected value signal to be provided to a memory under test; an OR comparator for outputting fail data when an output signal outputted by the memory under test is not matched with the expected value signal; a first FBM for storing the fail data in a first test; a second FBM for accumulating the fail data stored in the first FBM and fail data in a second test and storing therein the same; and a safe analysis section for performing a fail safe analysis on the memory under test with reference to the fail data stored in the first FBM. The first FBM accumulates the fail data stored in the second FBM and the fail data in the third test. The safe analysis section performs a fail safe analysis on the memory under test further with reference to the fail data stored in the second FBM.

9 Claims, 7 Drawing Sheets

TESTING APPARATUS AND TESTING METHOD

CROSS-REFERENCE TO RELATED APPLICATION

This is a continuation application of PCT/JP2005/004010 filed on Mar. 8, 2005 which claims priority from a Japanese Patent Application NO. 2004-74057 filed on Mar. 16, 2004, the contents of which are incorporated herein by reference.

BACKGROUND OF THE INVENTION

1. Field of the Invention

The present invention relates to a testing apparatus and a testing method. Particularly, the present invention relates to a testing apparatus and a testing method for testing a memory under test.

2. Related Art

Generally, a memory testing apparatus applies address signals and data signals generated by a pattern generator to a memory under test to write the same thereon. Then, the memory testing apparatus compares expected value signals generated by the pattern generator corresponding to the address signals and the data signals and stores fail data indicating that an output signal is not matched with an expected value signal on an address fail memory (hereinafter referred to as AFM) in a fail analysis memory for each address indicated by the address signal. Then, the memory testing apparatus perform a fail safe analysis on the memory under test with reference to the fail data stored in the AFM as disclosed in, for example, Japanese Patent Application Publication No.10-556964.

FIG. 6 shows a flow of tests and fail safe analyses according to a related art. A type of memory testing apparatus as shown in FIG. 6A has a capacity comparable with the memory under test and performs a fail safe analysis by referring the AFM which sequentially stores fail data after testing the memory under test. Another type of memory testing apparatus as shown in FIG. 6B has a fail buffer memory (hereinafter referred to as FBM) having a capacity comparable with the memory under test in a fail safe analyzer in addition to the AFM, transfers fail data from AFM to FBM and performs the fail safe analysis of the previous test in parallel with performing a next test, so that the throughput of the test can be improved. Such memory testing apparatus is effective for the case that the transfer time of fail data is sufficiently less than a time for the fail safe analysis. However, as the transfer time of fail data is increased in associated with significantly increasing the capacity of the memory under test, the throughput can not have been improved. Therefore, it is necessary to reduce the transfer time of fail data. Thus, a memory testing apparatus, as shown in FIG. 6C has been proposed, that has two AFMs and performs a fail safe analysis by sequentially storing fail data during testing in one AFM in parallel with transferring the fail data of the previous test from the other AFM to a FBM.

In a manner of memory test in recent years, a memory under test is tested multiple times and a fail safe analysis is performed by accumulating the multiple times of test results. FIG. 7 shows a flow of tests and fail safe analyses according to the related art. Analysis 1 is an analysis of the test result of test 1. Analysis 1+2 is an analysis of test result by accumulating test 1 and test 2. Analysis 1+2+3 is an analysis of the test result by accumulating test 1, test 2 and test 3. The flows as shown in FIG. 7A and 7B have not improved the throughput of the test as the transfer time of fail data is increased in associated with significantly increasing the capacity of the memory under test. Additionally, in the flow as shown in FIG. 7C, a FBM has to accumulate the fail data transferred from the other a AFM on the fail data transferred from one AFM by a read-modify-write operation, so that it takes a large amount of processing time to transfer the fail data from the AFM to the FBM. Therefore, if the number of times for test is increased, a latency time is generated to transfer fail data from the AFM to the FBM. Therefore, the advantage of using two AFMs is lost.

SUMMARY OF THE INVENTION

Thus, an object of the present invention is to provide a testing apparatus being capable of solving the problem accompanying the conventional art. This object is achieved by combining the features recited in independent claims. Then, dependent claims define further effective specific example of the present invention.

In order to solve the above-described problem, a first aspect of the present invention provides a testing apparatus for testing a memory under test. The testing apparatus includes: a pattern generator for generating an address signal and a data signal provided to the memory under test, and an expected value signal to be outputted by the memory under test according to the address signal and the data signal; a logic comparator for comparing an output signal outputted by the memory under test according to the address signal and the data signal with the expected value signal and outputting fail data when the output signal is not matched with the expected value signal; a first buffer memory for storing fail data of a first test on the memory under test in an address indicated by the address signal; a second fail buffer memory for accumulating the fail data stored in the first fail buffer memory and fail data of a second test on the memory under test and storing therein the same; and a first fail safe analysis section for performing a fail safe analysis on the memory under test with reference to the fail data stored in the first fail buffer memory. The first fail buffer memory accumulates the fail data stored in the second fail buffer memory and fail data of a third test on the memory under test and stores therein the same. The first safe analysis section performs a fail safe analysis on the memory under test further with reference to the fail data stored in the second fail buffer memory.

The testing apparatus may further include an OR circuit for performing an OR operation on the fail data of the second test and the fail data stored in the first fail buffer memory and storing the result in the second fail buffer memory, and for performing an OR operation on the fail data of the third test and the fail data stored in the second fail buffer memory and storing the result in the first fail buffer memory.

The testing apparatus may further include a first address fail memory for sequentially storing the fail data outputted by the logic comparator on an address indicated by the address signal. The first fail buffer memory may accumulate the fail data stored in the first address fail memory and the fail data stored in the second fail buffer memory and store therein the same. The second fail buffer memory may accumulate the fail data stored in the first address fail memory and the fail data stored in the first fail buffer memory and store therein the same.

The testing apparatus may further include a second address fail memory for sequentially storing the fail data outputted by the logic comparator in the second test on the address indicated by the address signal. The second fail buffer memory may accumulate in parallel with performing the third test the fail data stored in the first fail buffer memory and the fail data stored in the second address fail memory and store therein the same.

The first address fail memory may sequentially store the fail data outputted by the logic comparator in the third test on the address indicated by the address signal. The first fail buffer memory may accumulate in parallel with performing a fourth test the fail data stored in the second fail buffer memory and the fail data stored in the first address fail memory and store therein the same.

The testing apparatus may further include a delay circuit for delaying the fail data stored in the first address memory or the second address memory in order to match the timing at which the fail data stored in the first address fail memory or the second address fail memory is provided to the OR circuit with the timing at which the fail data stored in the first fail buffer memory or the second fail buffer memory is provided to the logic circuit and provide the same to the OR circuit.

The testing apparatus may further include a third fail buffer memory for storing fail data comparable with that in the first fail buffer memory or the second fail buffer memory in parallel with the first fail buffer memory or the second fail buffer memory, and a second safe analysis section for performing in parallel with the first safe analysis section a fail safe analysis on the memory under test with reference to the fail data stored in the third fail buffer memory.

The testing apparatus may further include a third safe analysis section for performing in parallel with the first safe analysis section a fail safe analysis on the memory under test with reference to the fail data stored in the first fail buffer memory.

A second aspect of the present invention provides a testing method for testing a memory under test. The testing method comprising: providing an address signal and a data signal to a memory under test; comparing an output signal outputted by a memory under test according to the address signal and the data signal with an expected value signal to be outputted by the memory under test according to the address signal and the data signal and generating fail data when the output signal is not matched with the expected value signal; storing sequentially the fail data on an address indicated by the address signal in the first address fail memory as in parallel with performing a first test on the memory under test; storing sequentially the fail data on the address indicated by the address signal in the second address fail memory in parallel with performing a second test on the memory under test; reading the fail data stored in the first address fail memory to the first fail buffer memory in parallel with performing the second test to perform a fail safe analysis on the memory under test; storing sequentially the fail data on the address indicated by the address signal in the first address fail memory in parallel with performing a third test on the memory under test; and accumulating in parallel with performing the third test the fail data stored in the first fail memory and the fail data stored in the second address fail memory, reading the same to the second fail buffer memory, and performing a fail safe analysis on the memory under test with reference to the fail data stored in the second fail buffer memory.

Here, all necessary features of the present invention are not listed in the summary of the invention. The sub-combinations of the features may become the invention.

According to the testing apparatus of the present invention, the time for transferring fail data from a fail analysis memory to a fail safe analyzer can be reduced to improve the throughput of the test.

DETAILED DESCRIPTION OF THE INVENTION

Hereinafter, the present invention will be described through preferred embodiments. The embodiments do not limit the invention according to claims and all combinations of the features described in the embodiments are not necessarily essential to means for solving the problems of the invention.

Figure 1:
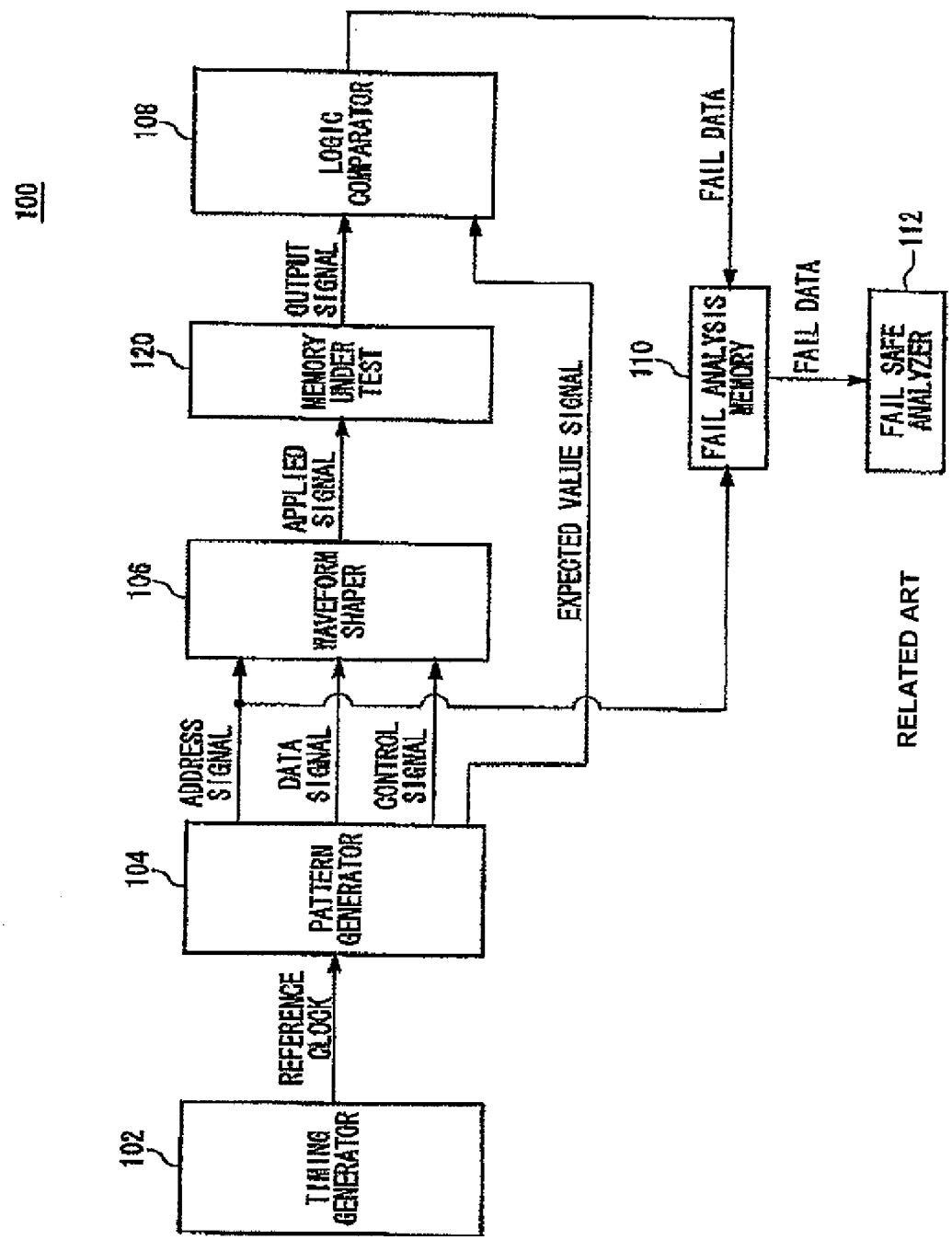
FIG. 1 shows the configuration of a testing apparatus 100 according to a related art.

FIG. 1 shows an example of the configuration of a testing apparatus according to a related art. The testing apparatus 100 includes a timing generator 102, a pattern generator 104, a waveform shaper 106, a logic comparator 108, a fail analysis memory 110 and a fail safe analyzer 112.

The timing generator 102 generates a reference clock and provides the same to the pattern generator 104. The pattern generator 104 generates an address signal, a data signal and a control signal to be provided to the memory under test 120 based on the reference clock, and provides the same to the waveform shaper 106. Additionally, the pattern generator 104 generates an expected value signal to be outputted by the memory under test 120 according to the address signal, the data signal and the control signal, and provides the same to the logic comparator 108. The waveform shaper 106 shapes the address signal, the data signal and the control signal into the waveform required for testing the memory under test 120, and applies the same to the memory under test 120.

The logic comparator 108 compares an output signal outputted by the memory under test 120 according to the address signal with an expected value signal generated by the pattern generator 104, the data signal and the control signal, and provides the same to the fail analysis memory 110 when the output signal is not matched with the expected value signal. The fail analysis memory 110 stores the fail data on the address indicated by the address signal. After performing the test on the memory under test 120, the fail safe analyzer 112 reads the fail data stored in the fail analysis memory 110 to perform a fail safe analysis on the memory under test 120.

Figure 2:
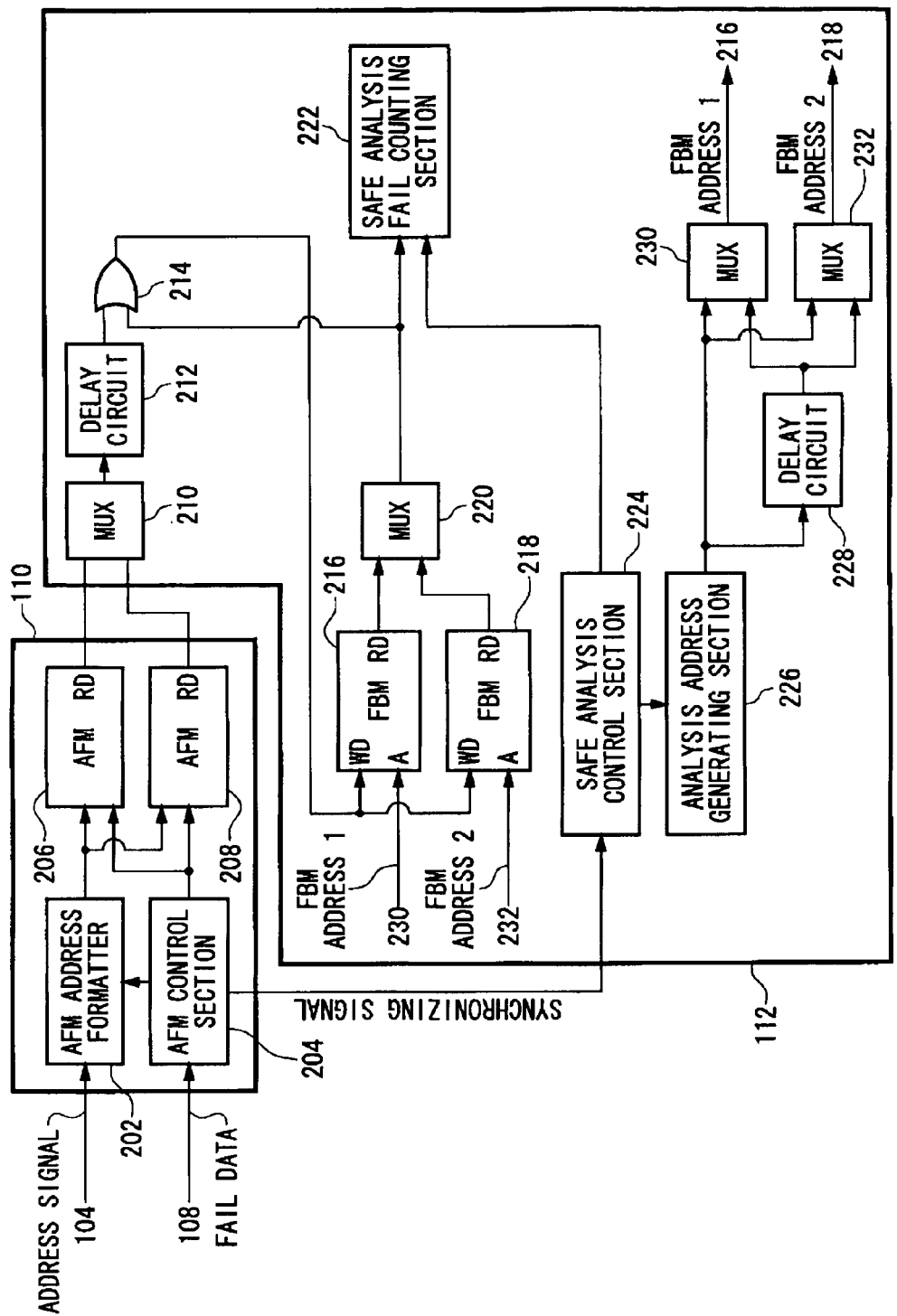
FIG. 2 shows the configuration of a fail analysis memory 110 and a fail safe analyzer 112.

FIG. 2 shows an example of configuration of the fail analysis memory 110 and the fail safe analyzer 112. The fail analysis memory includes an AFM address formatter 202, an AFM control section 204, an AFM 206 and an AFM 208. The fail safe analyzer 112 includes a multiplexer circuit (hereinafter referred to as MUX) 210, a delay circuit 212, a logic circuit 214, a FBM 216, a FBM 218, a MUX 220, a safe analysis fail counting section 222, a safe analysis control section 224, an analysis address generating section 226, a delay circuit 228, a MUX 230 and a MUX 232. Each of the AFM 206, the AFM 208, the FBM 216 and FBM 128 has capacity comparable with the memory under test. Here, the safe analysis fail counting section 222 is an example of the first safe analysis section according to the present invention.

The AFM address formatter 202 formats the address signal generated by the pattern generator 104 and provides the same to the AFM 206 or the AFM 208. The AFM control section 204 provides the fail data outputted by the logic comparator 108 to the AFM 206 and the AFM 208. Additionally, the AFM control section 204 provides a synchronizing signal to the AFM address formatter 202 and the safe analysis control section 224 to control the operating timing. The AFM 206 and the AFM 208 sequentially store the fail data provided from the AFM control section 204 on the address indicated by the address signal provided by the AFM address formatter 202. When the test is performed on the memory under test multiple times, the AFM 206 and the AFM 208 are switched to be used for each test.

The MUX 210 switches the data read from the AFM 206 and the AFM 208 and provides the same to the delay circuit 212. The delay circuit 212 delays the fail data stored in the AFM 206 or the AFM 208 in order to match the timing at which the fail data stored in the AFM 206 or the AFM 208 is provided to the OR circuit 214 with the timing at which the fail data stored in the FBM 216 or the FBM 218 is provided to the OR circuit 214, and provides the same to the OR circuit 214. The OR circuit 214 performs an OR operation on the fail data stored in the AFM 206 or the AFM 208 and the fail data stored in the FBM 216 or the FBM 218, and provides the result to the FBM 216 or the FBM 218 to cause the FBM 216 or the FBM 218 to store the result.

The safe analysis control section 224 controls the operation of the safe analysis fail counting section 222 and the analysis address generating section 226 based on the synchronizing signal provided from the AFM control section 204. The analysis address generating section 226 generates FBM address 1 and FBM address 2 to be provided to the FBM 216 and the FBM 218 based on the control of the safe analysis control section 224. Here, each of the FBM address 1 and the FBM address 2 indicates an address the same as the addresses indicated by the address signal generated by the pattern generator 104. The delay circuit 228 delays the FBM address 1 and the FBM address 2 generated by the analysis address generating section 226 in order to match the timing at which the fail data is provided from the OR circuit 214 to the FBM 216 or the FBM 218 with the timing at which the FBM address 1 or the FBM address 2 is provided to the FBM 216 or the FBM 218, and provides the same to the MUX 230 and the MUX 232.

The MUX 230 and the MUX 232 switch the FBM address 1 and the FBM address 2 generated by the analysis address generating section 226 with the FBM address 1 and the FBM address 2 delayed by the delay circuit 228 and provide the same to the FBM 216 and the FBM 218. Specifically, reading the fail data from the FBM 216 and writing the same to the FBM 218, the MUX 230 selects the FBM address 1 generated by the analysis address generating section 226, and the MUX 232 selects the FBM address 2 delayed by the delay circuit 228. Meanwhile, reading the fail data from the FBM 218 and writing the same to the FBM 216, the MUX 230 selects the FBM address 1 delayed by the delay circuit 228, and the MUX 232 selects the FBM address 2 generated by the analysis address generating section 226.

The FBM 216 stores the fail data provided from the OR circuit 214 based on the FBM address 1. The FBM 218 stores the fail data provided from the OR circuit 214 based on the FBM address 2. The MUX 220 switches the fail data read from the FBM 216 with the fail data read from the FBM 218 and provides the same to the OR circuit 214 and the safe analysis fail counting section 222. The safe analysis fail counting section 222 performs a fail safe analysis such as counting the fail cells in the memory under test 120 with reference to the fail data provided from the MUX 220.

Here, it has been described that the fail analysis memory 110 according to the present embodiment has two AFMs. However, it is evident according to Claims that the testing apparatus according to the present invention may have only one AFM. In this case, the FBM 216 accumulates the fail data stored in the AFM and the fail data stored in the FBM 218 and stores therein the same, and the FBM 218 accumulates the fail data stored in the AFM and the fail data stored in the FBM 216 and stores therein the same.

Figure 3:
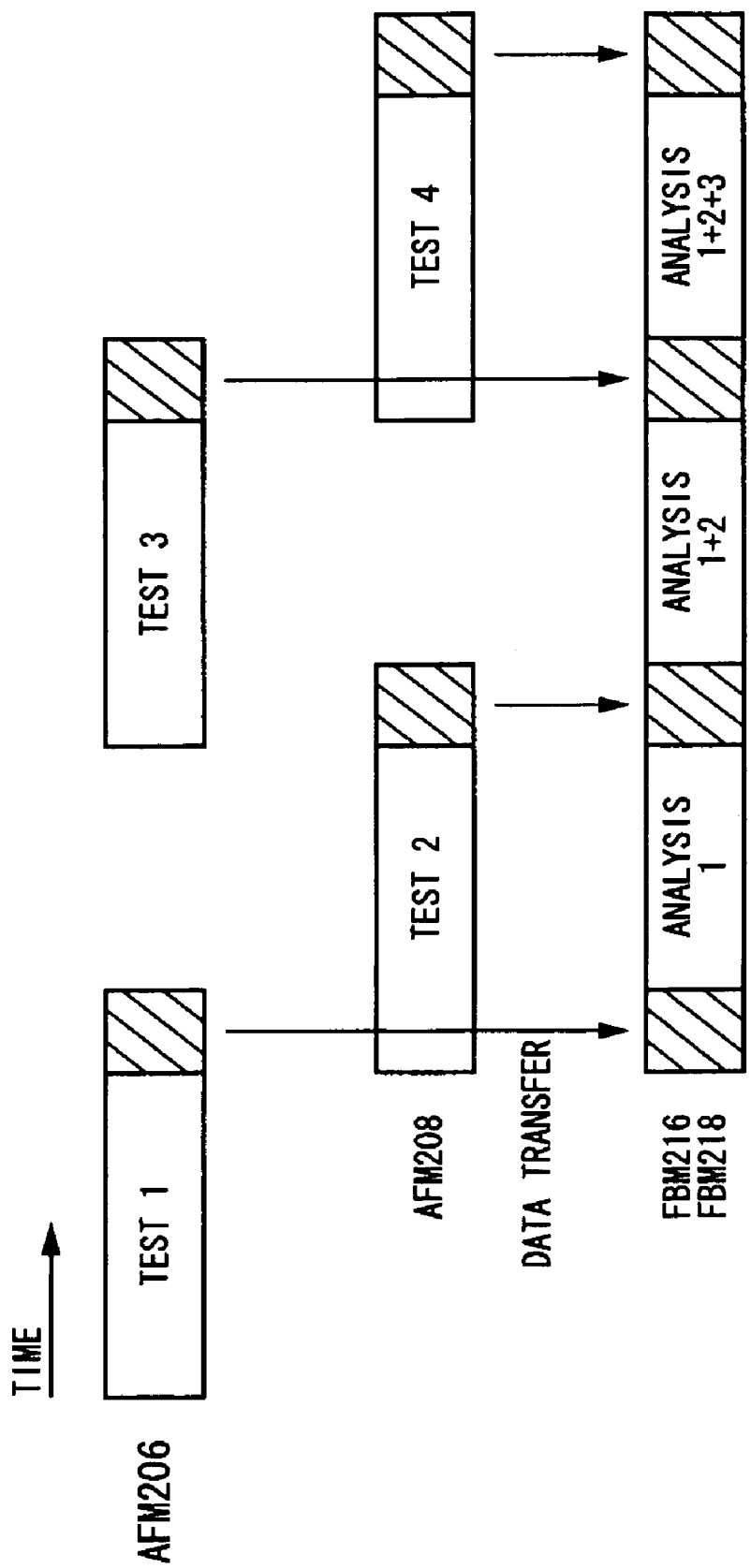
FIG. 3 shows a flow of tests and fail safe analyses by the testing apparatus 100.

FIG. 3 shows an example of flow of tests and fail safe analyses by the testing apparatus 100 according to the present embodiment. Hereinafter, the flow of tests and fail safe analyses will be described with reference to FIG. 2 and FIG. 3. Firstly, the AFM 206 sequentially stores the fail data outputted by the logic comparator 108 in a first test performed on the memory under test 120 on the address indicated by the address signal generated by the pattern generator 104. When the first test on the memory under test is finished, a second test on the memory under test 120 is started, and then, the AFM 208 sequentially stores the fail data outputted by the logic comparator 108 in the second test performed on the memory under test 120 on the address indicated by the address signal generated by the pattern generator 104. Additionally, the first test on the memory under test 120 is finished, the MUX 210 selects the fail data of the first test stored in the AFM 206. Then, The fail data is transferred from the AFM 206 to the FBM 216 in parallel with performing the second test on the memory under test 120. Then, the FBM 216 reads the fail data of the first test on the memory under test 120 stored in the AFM 206 and stores therein the same based on the FBM address 1 generated by the analysis address generating section 226. Then, after FBM 216 reads the fail data, the safe analysis fail counting section 222 performs a fail safe analysis on the memory under test 120 with reference to fail data stored in the FBM 216.

When the second test on the memory under test 120 is finished, a third test is started to perform on the memory under test 120. In the third test on the memory under test 120, the AFM 206 sequentially stores the fail data outputted by the logic comparator 108 in the third test on the memory under test 120 on the address indicated by the address signal generated by the pattern generator 104. Additionally, when the second test on the memory under test 120 is finished, the MUX 210 selects the fail data of the second test stored in the AFM 208. The fail data is started to transfer from the AFM 208 to the FBM 218 in parallel with performing the third test on the memory under test 120. Here, the MUX 220 selects the fail data of the first test stored in the FBM 216 and provides the same to the OR circuit 214. Then, the OR circuit 214 performs an OR operation on the fail data of the second test provided from the MUX 210 and the fail data of the first test provided from the MUX 220 and provides the result to the FBM 218. Then, the FBM 218 accumulates the fail data of the second test on the memory under test 120 stored in the AFM 208 and the fail data of the first test on the memory under test 120 stored in the FBM 216 and stores therein the same. Then, after FBM 218 reads the fail data, the safe analysis fail counting section 222 performs a fail safe analysis on the memory under test 120 with reference to the fail data stored in the FBM 218.

When the third test on the memory under test is finished, a fourth test is started to perform on the memory under test 120. In the forth test on the memory under test 120, the AFM 208 sequentially stores the fail data outputted by the logic comparator 108 on the address indicated by the address signal generated by the pattern generator 104. Additionally, when the third test on the memory under test is finished, the MUX 210 selects the fail data of the third test stored in the AFM 206. Then, the fail data is started to transfer from the AFM 206 to the FBM 216 in parallel with performing the fourth test on the memory under test 120. Here, the MUX 220 selects the fail data in which the first test and second test stored in the FBM 218 are accumulated and provides the same to the OR circuit 214. Then, the OR circuit 214 performs an OR operation on the fail data of the third test provided from the MUX 210 and the fail data in which the first test and the second test provided from the MUX 220 are accumulated, and provides the result to the FBM 216. Then, the FBM 216 accumulates the fail data of the third test on the memory under test stored in the AFM 206 and the fail data in which the first test and the second test on the memory under test stored are accumulated, which is stored in the FBM 216 and stores the same. Then, after the FBM 216 reads the fail data, the safe analysis fail counting section 222 performs a fail safe analysis on the memory under test 120 with reference to the fail data stored in the FBM 216.

According to the testing apparatus 100 of the present embodiment, the fail safe analyzer 112 has the FBM 216, the FBM 218 and the OR circuit 214, so that any one of the FBM 216 and the FBM 218 reads the fail data while the other of FBM 216 and the FBM 218 writes the fail data. Therefore, the FBM 216 or the FBM 218 need not to perform a read-modify-write operation when the AFM 206 or the AFM 208 transfers the fail data, so that the fail data can be transferred at high speed. Additionally, an unnecessary processing time other than the time for testing the memory under test 120 can be reduced and the test can be continuously performed on the memory under test 120. Thus, even if the number of times of test on the memory under test is increased, both of the AFM 206 and the AFM 208 can be efficiently utilized without generating any latency time to transfer the fail data from the AFM 206 and the AFM 208 to the FBM 216 and the FBM 218, so that the throughput of the test can be improved.

Figure 4:
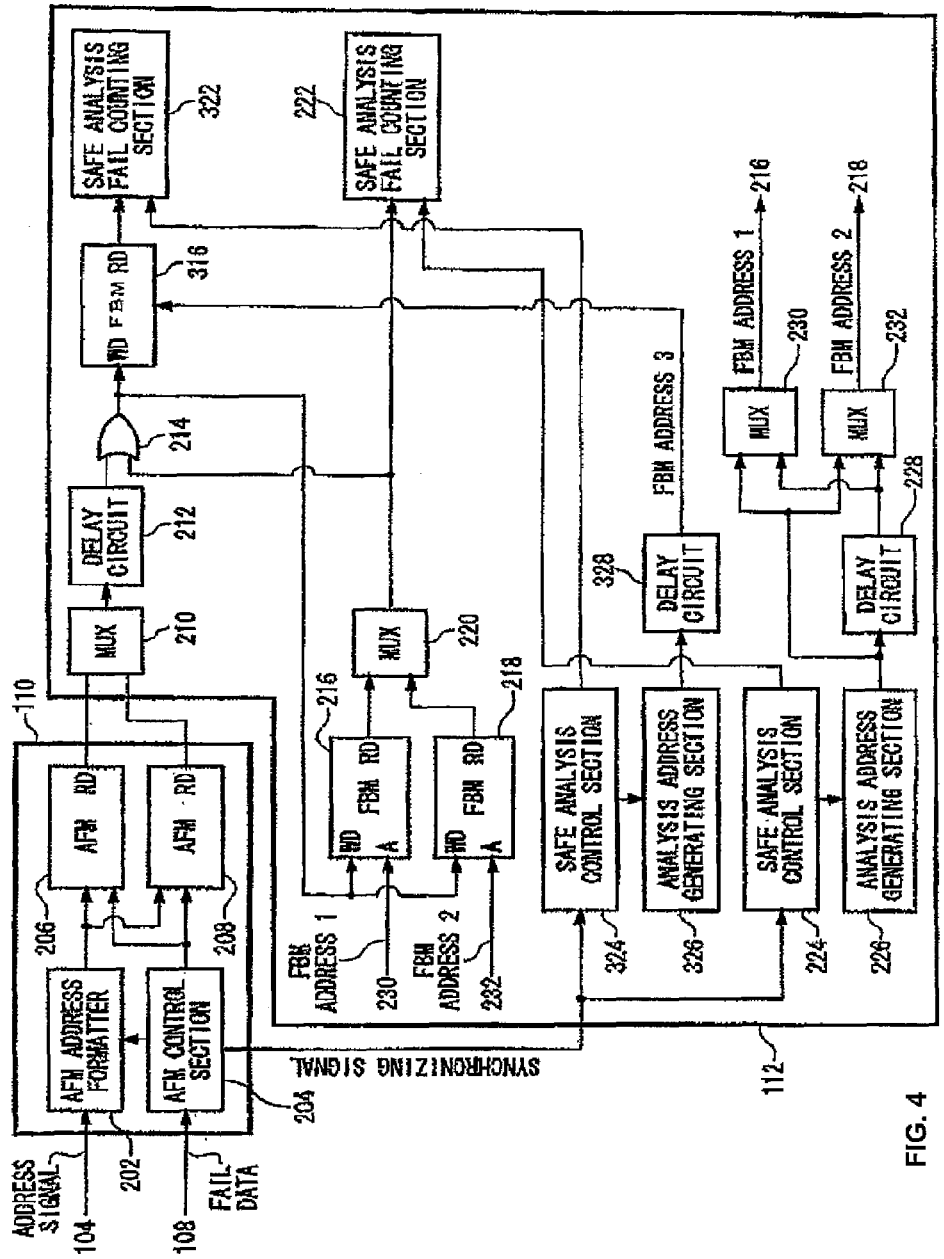
FIG. 4 shows a first modification of the configuration of the fail safe analysis 112.

FIG. 4 shows a first modification of the configuration of a fail safe analyzer 112. The fail safe analyzer 112 may further include a FBM 316, a safe analysis fail counting section 322, a fail analysis control section 324, an analysis address generator 326 and a delay circuit 328 in addition to the components shown in FIG. 2. Here, the safe analysis fail counting section 322 is an example of the second safe analysis section according to the present invention. The components in FIG. 4 having reference numerals the same as those in FIG. 2 have operations and functions the same as those of the components described with reference to FIG. 2 except for components described below, so that the description is omitted.

The safe analysis control section 324 controls the operation of the safe analysis fail counting section 322 and the analysis address generating section 326 based on the synchronizing signal provided from the AFM control section 204. Additionally, the analysis address generating section 326 generates a FBM address 3 to be provided to the FBM 316 based on the control of the safe analysis control section 324. Here, the FBM address 3 indicates an address the same as the address indicated by the address signal generated by the pattern generator 104. The delay circuit 328 delays the FBM address 3 generated by the analysis address generating section 326 in order to match the timing at which the fail data is provided from the OR circuit 214 to the FBM 316 with the timing at which the FBM address 3 is provided to the FBM 316 and provides the same to the FBM 316.

The FBM 316 stores in parallel with the FBM 216 or the FBM 218 the fail data the same as the FBM 216 or the FBM 218 based on the FBM address 3. Then, the safe analysis fail counting section 322 performs in parallel with the safe analysis fail counting section 222 a fail safe analysis on the memory under test 120 with reference with the fail data stored in the FBM 316. That is to say, the safe analysis fail counting section 222 and the safe analysis fail counting section 322 perform concurrently fail safe analysis on the same fail data stored in each of the FBM 216 or the FBM 218 and FBM 316, respectively.

According to the modification, the safe analysis fail counting section 222 and the safe analysis fail counting section 322 can perform concurrently fail safe analysis on the same fail data, so that the time for a fail safe analysis can be reduced to half.

Therefore, even if the time for a fail safe analysis is longer in comparison with the time for testing the memory under test 120, the fail safe analysis can be performed without generating any latency time to transfer the fail data from the AFM 206 or the AFM 208 to the FBM 216 or the FBM 218, so that the throughput of the test can be improved.

Figure 5:
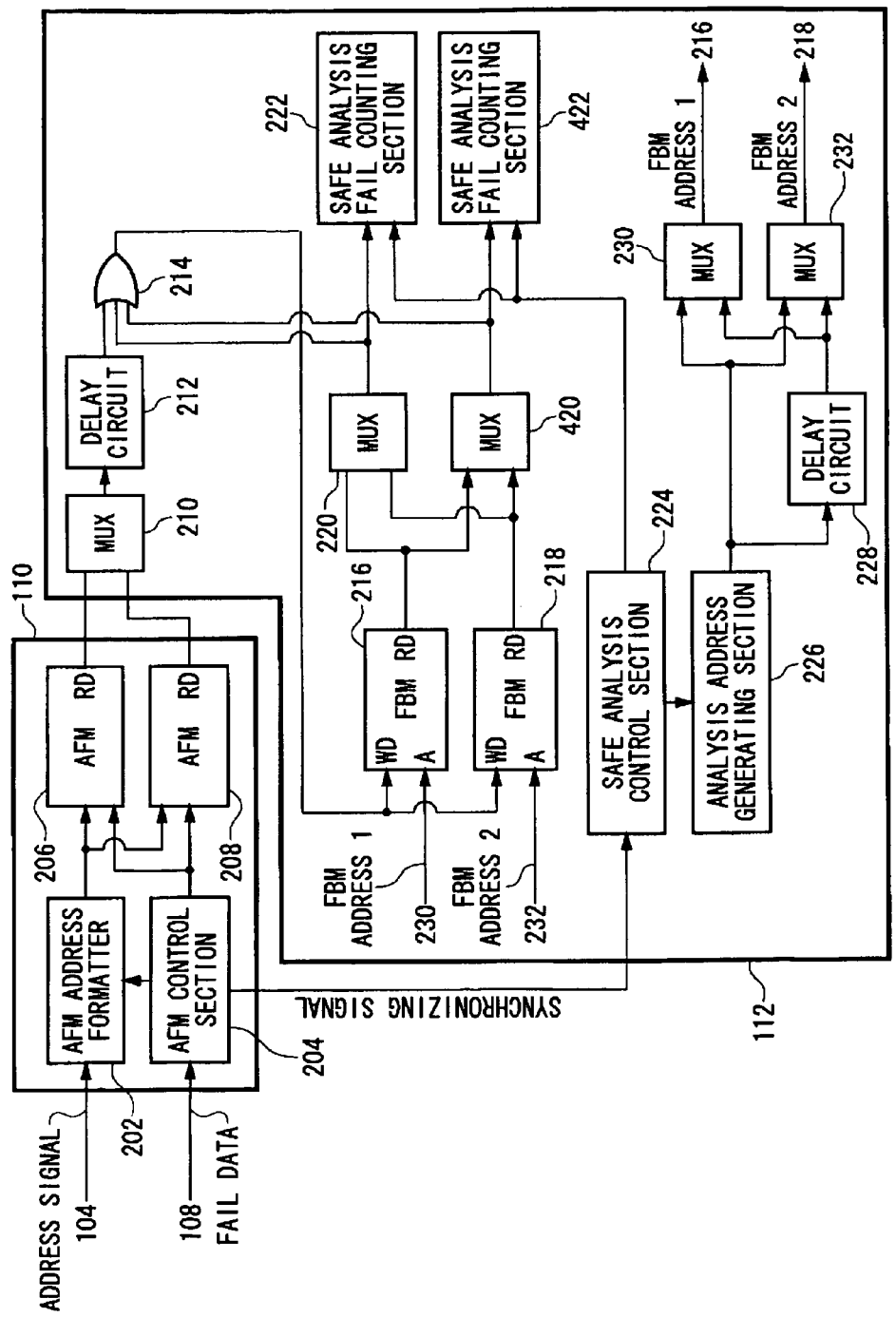
FIG. 5 shows a second modification of the configuration of the fail safe analysis 112.
Figure 6A:
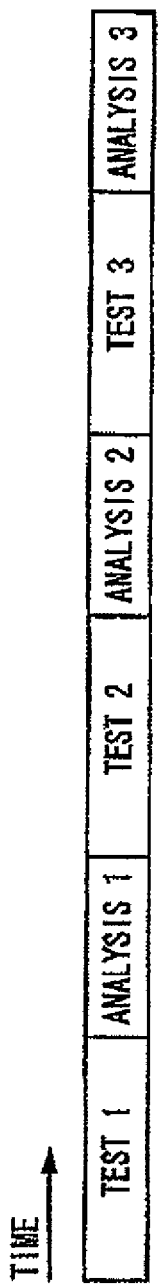
FIGS. 6A-6C show a flow of tests and fail safe analyses according to a related art.
Figure 6B:
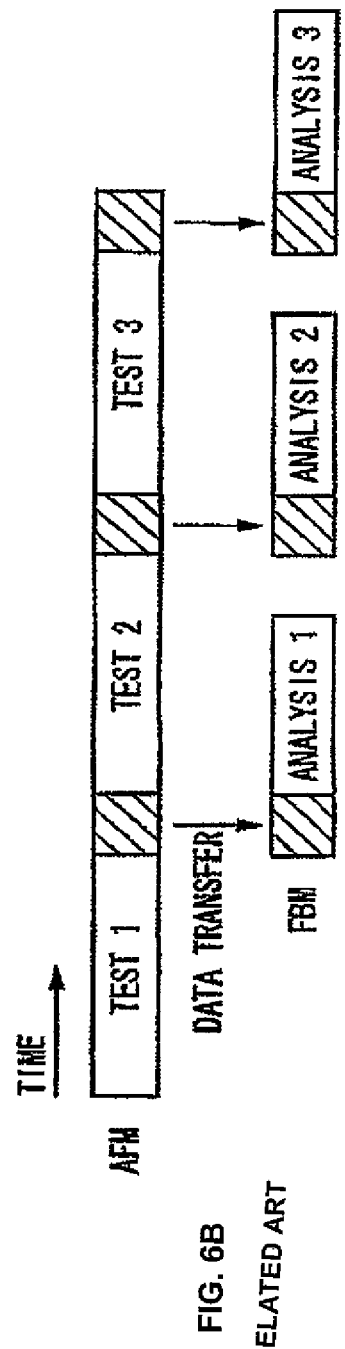
Figure 6C:
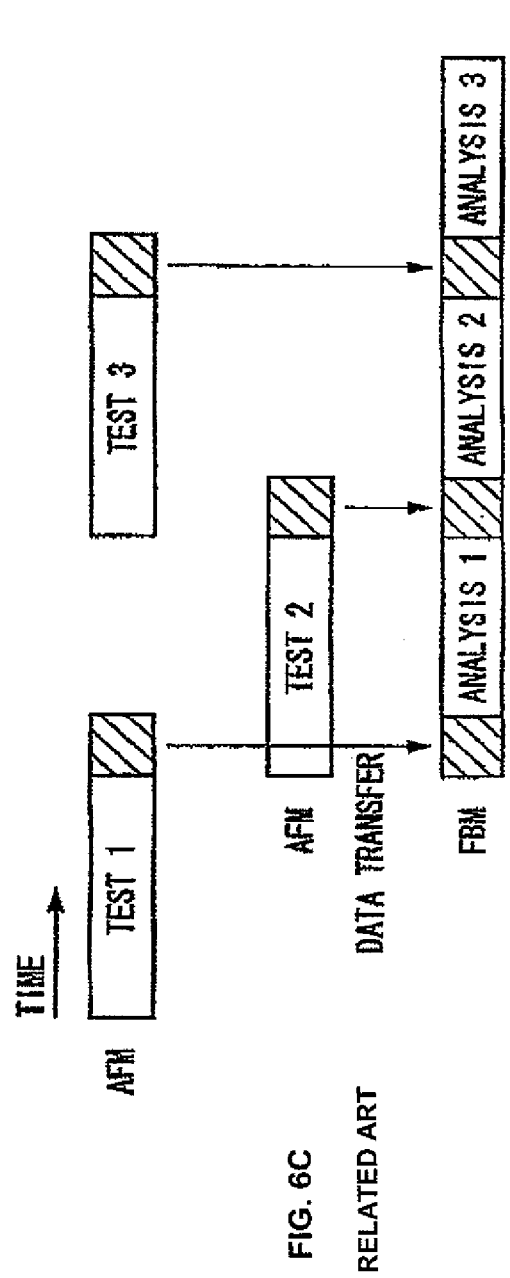
Figure 7A:
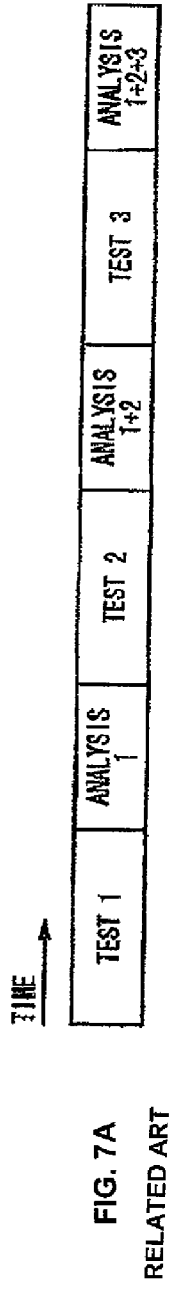
FIGS. 7A-7C show a flow of tests and fail safe analyses according to a related art.
Figure 7B:
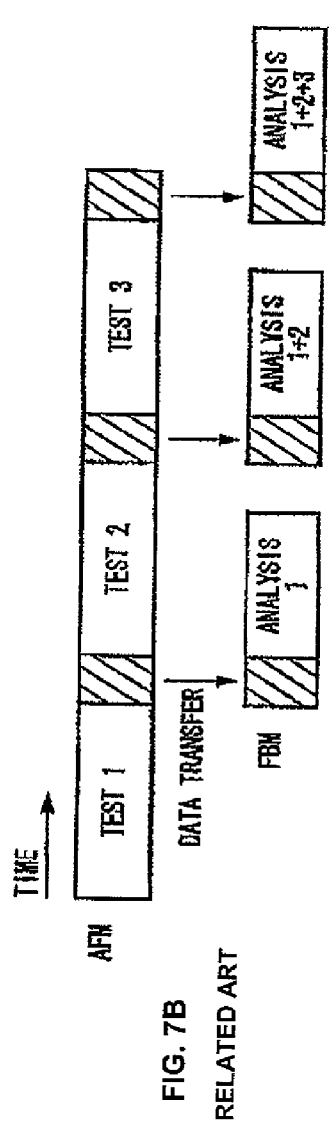
Figure 7C:
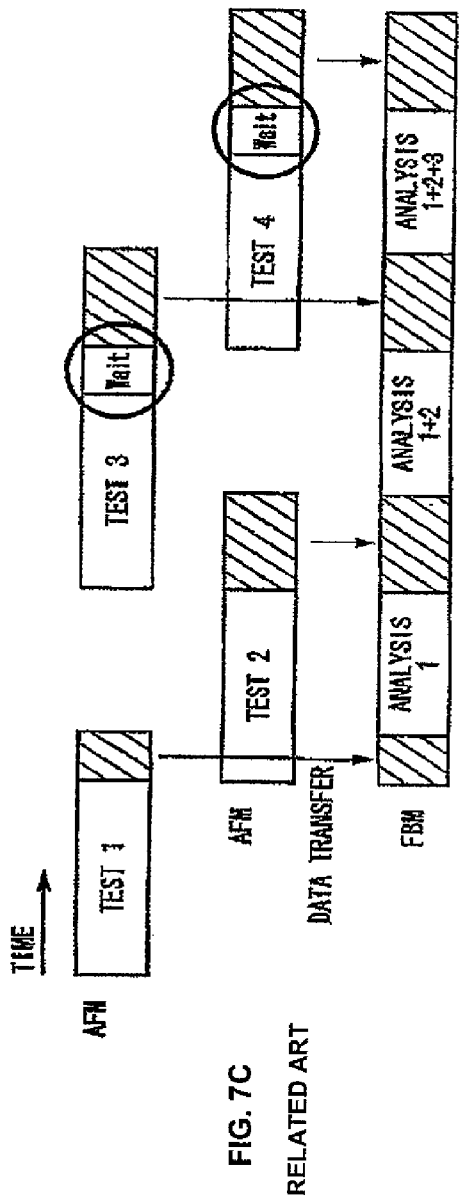

FIG. 5 shows a second modification of the fail safe analyzer 112 according to the present embodiment. The fail safe analyzer 112 may further include a MUX 420 and a safe analysis fail counting section 422 in addition to the components shown in FIG. 2. Here, the safe analysis fail counting section 422 is an example of the third safe analysis section according to the present invention. The components in FIG. 5 having reference numerals the same as those in FIG. 2 have operations and functions the same as those of the components described with reference to FIG. 2 except for components described below, so that the description is omitted.

The MUX 420 switches the fail data read from the FBM 216 with the fail data read from the FBM 218 and provides the same to the OR circuit 214 and the safe analysis fail counting section 422. The safe analysis fail counting section 422 performs in parallel with the safe analysis fail counting section 222 a fail safe analysis on the memory under test 120 with reference to the fail data provided from the MUX 420.

According to the modification, the safe analysis fail counting section 222 and the safe analysis fail counting section 422 can perform concurrently a fail safe analysis on the sane fail data stored in the FBM 216 or the FBM 218, so that the time for the fail safe analysis can be reduces to half. Therefore, even if the time for the fail safe analysis is longer in comparison with the time for testing the memory under test 120, the fail safe analysis can be performed without generating any latency time to transfer the fail data from the AFM 206 or the AFM 208 to the FBM 216 or the FBM 218, so that the throughput of the test can be improved.

While the present invention have been described with the embodiment, the technical scope of the invention not limited to the above described embodiment. It is apparent to persons skilled in the art that various alternations and improvements can be added to the above-described embodiment. It is apparent from the scope of the claims that the embodiment added such alternation or improvements can be included in the technical scope of the invention.

As evidenced by the above description, the test apparatus according to the present invention can reduce the time for transferring the fail data from the fail analysis memory to the fail safe analyzer to improve the throughput of the test.

What is claimed is:

1. A testing apparatus for testing a memory under test, comprising:
 a pattern generator for generating an address signal and a data signal to be provided to the memory under test, and an expected value signal indicating an expected value that the memory under test outputs in a normal state, according to the address signal and the data signal;
 a logic comparator for comparing an output signal outputted by the memory under test according to the address signal and the data signal with the expected value signal and outputting fail data when the output signal is not matched with the expected value signal, the fail data comprising a first fail data from a first test of the memory under test, a second fail data from a second test of the memory under test, and a third fail data from a third test of the memory under test;
 a first fail buffer memory for storing the first fail data on an address indicated by the address signal;
 a second fail buffer memory for accumulating the first fail data stored in the first fail buffer memory and the second fail data and storing the first and second fail data;
 a fail data transmitting section for receiving the fail data from the logic comparator and one of the fail data stored in the first fail buffer memory and the fail data stored in the second fail buffer memory, performing an operation based on the received fail data, and providing a result of the operation to the first fail buffer memory or the second fail buffer memory; and
 a first safe analysis section for performing a fail safe analysis on the memory under test with reference to the first fail data stored in the first fail buffer memory,
wherein
 the first fail buffer memory accumulates the first and second fail data stored in the second fail buffer memory and the third fail data and stores the first second and third fail data, and
 the first safe analysis section performs a fail safe analysis on the memory under test further with reference to the first and second fail data stored in the second fail buffer memory.

2. The testing apparatus according to claim 1 further comprising an OR circuit for performing an OR operation on the second fail data and the fail data stored in the first fail buffer memory and storing the result in the second fail buffer memory, and for performing an OR operation on the third fail data and the fail data stored in the second fail buffer memory and storing the result in the first fail buffer memory.

3. The testing apparatus according to claim 2 further comprising a first address fail memory for storing sequentialty the first fail data outputted by the logic comparator on the address indicated by the address signal, wherein
 the first fail buffer memory accumulates and stores the fail data stored in the first address fail memory and the fail data stored in the second fail buffer memory, and
 the second fail buffer memory accumulates and stores the fail data stored in the first address fail memory and the fail data stored in the first fail buffer memory.

4. The testing apparatus according to claim 3 further comprising a second address fail memory for storing sequentially the second fail data outputted by the logic comparator on the address indicated by the address signal, wherein
 the second fail buffer memory accumulates and stores the fail data stored in the first fail buffer memory and the fail data stored in the second address fail memory in parallel with performing the third test of the memory under test.

5. The testing apparatus according to claim 4, wherein
 the first address fail memory sequentially stores therein the third fail data outputted by the logic comparator on the address indicated by the address signal, and
 the first fail buffer memory accumulates and stores the fail data stored in the second fail buffer memory and the fail data stored in the first address fail memory in parallel with performing a fourth test of the memory under test.

6. The testing apparatus according to claim 5 further comprising a delay circuit for delaying the fail data stored in the first address fail memory or the second address fail memory in order to match the timing at which the fail data stored in the first address fail memory or the second address fail memory is provided to the OR circuit with the timing at which the fail data stored in the first fail buffer memory or the second fail buffer memory is provided to the OR circuit and providing the delayed fail data to the OR circuit.

7. The testing apparatus according to claim 1 further comprising:
 a third fail buffer memory for storing in parallel with the first fail buffer memory or the second fail buffer memory fail data that is the same as the fail data provided to the first fail buffer memory or the second fail buffer memory; and
 a second safe analysis section for performing in parallel with the first safe analysis section a fail safe analysis on the memory under test with reference to the fail data stored in the third fail buffer memory.

8. The testing apparatus according to claim 1 further comprising a third safe analysis section for performing in parallel with the first safe analysis section a fail safe analysis of the memory under test with reference to the first fail data stored in the first fail buffer memory.

9. A testing method for testing a memory under test, comprising:
 providing an address signal and a data signal to the memory under test;
 comparing an output signal outputted by the memory under test according to the address signal and the data signal with an expected value signal indicating an expected value that the memory under test outputs in a normal state according to the address signal and the data signal, and generating fail data when the output signal in not matched with the expected value signal, the fail data comprising a first fail data from a first test of the memory under test, a second fail data from a second test of the memory under test, and a third fail data from a third test of the memory under test;
 storing sequentially the first fail data on an address in a first address fail memory indicated by the address signal in parallel with performing a first test of the memory under test;
 storing sequentially the second fail data on an address in a second address fail memory indicated by the address signal in parallel with performing a second test of the memory under test;
 reading the fail data stored in the first address fail memory to a first fail buffer memory in parallel with performing the second test, and performing a fail safe analysis on the memory under test with reference to the fail data stored in the first fail buffer memory;
 storing sequentially the third fail data on the address in the first address fail memory indicated by the address signal in parallel with performing a third test of the memory under test;
 accumulating and storing in a second fail buffer memory the fail data stored in the first fail buffer memory and the fail data stored in the second address fail memory in parallel with performing the third test, and performing a fail safe analysis on the memory under test with reference to the first and second fail data stored in the second fail buffer memory; and receiving the generated fail data and one of the fail data stored in the first fail buffer memory and the fail data stored in the second fail buffer memory, performing an operation based on the received data, and providing a result of the operation to the first fail buffer memory or the second fail buffer memory.

* * * * *